(12) United States Patent
Miyoshi et al.

(10) Patent No.: US 8,890,208 B2
(45) Date of Patent: Nov. 18, 2014

(54) GROUP III NITRIDE EPITAXIAL SUBSTRATE FOR SEMICONDUCTOR DEVICE, SEMICONDUCTOR DEVICE, AND PROCESS FOR PRODUCING GROUP III NITRIDE EPITAXIAL SUBSTRATE FOR SEMICONDUCTOR DEVICE

(75) Inventors: Makoto Miyoshi, Nagoya (JP);
Yoshitaka Kuraoka, Nagoya (JP);
Shigeaki Sumiya, Nagoya (JP);
Mitsuhiro Tanaka, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 710 days.

(21) Appl. No.: 12/884,560

(22) Filed: Sep. 17, 2010

(65) Prior Publication Data
US 2011/0024795 A1 Feb. 3, 2011

Related U.S. Application Data

(63) Continuation of application No. PCT/JP2009/054952, filed on Mar. 13, 2009.

(30) Foreign Application Priority Data

Mar. 24, 2008 (JP) .................................. 2008-075581

(51) Int. Cl.
*H01L 29/66* (2006.01)
*H01L 21/02* (2006.01)
*H01L 29/778* (2006.01)
*H01L 29/20* (2006.01)
*C23C 16/30* (2006.01)
*H01L 29/201* (2006.01)

(52) U.S. Cl.
CPC ...... *H01L 29/2003* (2013.01); *H01L 29/66462* (2013.01); *H01L 21/02433* (2013.01); *H01L 29/778* (2013.01); *H01L 21/02458* (2013.01); *H01L 21/0237* (2013.01); *H01L 21/0262* (2013.01); *H01L 21/02378* (2013.01); *H01L 29/7786* (2013.01); *H01L 21/0254* (2013.01); *C23C 16/303* (2013.01); *H01L 29/201* (2013.01)
USPC ............................ 257/192; 438/167; 438/191

(58) Field of Classification Search
None
See application file for complete search history.

(56) References Cited

U.S. PATENT DOCUMENTS

| 6,429,467 | B1 | 8/2002 | Ando |
| 8,378,386 | B2* | 2/2013 | Miyoshi et al. ............... 257/192 |

(Continued)

FOREIGN PATENT DOCUMENTS

| JP | 11-297713 A1 | 10/1999 |
| JP | 2000-223697 A1 | 8/2000 |

(Continued)

OTHER PUBLICATIONS

Toshihide Kikkawa, "*Highly Reliable 250 W High Electron Mobility Transistor Power Amplifier*," Japanese Journal of Applied Physics, vol. 44, No. 7A, 2005, pp. 4896-4901.

(Continued)

*Primary Examiner* — Andres Munoz
(74) *Attorney, Agent, or Firm* — Burr & Brown, PLLC

(57) ABSTRACT

Provided is an epitaxial substrate capable of manufacturing a HEMT device that has excellent two-dimensional electron gas characteristics and is capable of performing normally-off operation. A channel layer is formed of a first group III nitride represented by $In_{x1}Al_{y1}Ga_{z1}N$ (x1+y1+z1=1) so as to have a composition in a range determined by x1=0 and 0≤y1≤0.3. A barrier layer is formed of a second group III nitride represented by $In_{x2}Al_{y2}Ga_{z2}N$ (x2+y2+z2=1) so as to have a composition, in a ternary phase diagram with InN, AlN and GaN being vertices, in a range surrounded by four straight lines determined in accordance with the composition (AlN molar fraction) of the first group III nitride and to have a thickness of 5 nm or less.

14 Claims, 13 Drawing Sheets

○ 2DEG CONCENTRATION EQUAL TO OR LARGER THAN 1e+13/cm² AND POSITIVE THRESHOLD VOLTAGE
△ 2DEG CONCENTRATION LESS THAN 1e+13/cm²
✕ NEGATIVE THRESHOLD VOLTAGE

(56) References Cited

U.S. PATENT DOCUMENTS

| | | | |
|---|---|---|---|
| 8,410,552 B2* | 4/2013 | Miyoshi et al. | 257/342 |
| 2002/0167023 A1 | 11/2002 | Chavarkar et al. | |
| 2003/0218183 A1 | 11/2003 | Micovic et al. | |
| 2004/0155260 A1 | 8/2004 | Kuzmik | |
| 2005/0173728 A1 | 8/2005 | Saxler | |
| 2006/0255364 A1 | 11/2006 | Saxler et al. | |
| 2007/0295990 A1* | 12/2007 | Higashiwaki | 257/192 |
| 2008/0067549 A1 | 3/2008 | Dadgar et al. | |
| 2009/0045438 A1 | 2/2009 | Inoue et al. | |

FOREIGN PATENT DOCUMENTS

| | | |
|---|---|---|
| JP | 2001-326232 A1 | 11/2001 |
| JP | 2002-076024 | 3/2002 |
| JP | 2003-178976 A1 | 6/2003 |
| JP | 2003-243424 A1 | 8/2003 |
| JP | 2005-509274 A1 | 4/2005 |
| JP | 2005-268493 A1 | 9/2005 |
| JP | 2005-277357 A1 | 10/2005 |
| JP | 2006-196557 A1 | 7/2006 |
| JP | 2006-222191 A1 | 8/2006 |
| JP | 2006-286698 A | 10/2006 |
| JP | 2006-303259 A1 | 11/2006 |
| JP | 2007-142003 A1 | 6/2007 |
| JP | 2007-158143 A1 | 6/2007 |
| JP | 2007-165431 A1 | 6/2007 |
| JP | 2007-535138 A1 | 11/2007 |
| JP | 2008-034658 A1 | 2/2008 |
| JP | 2008-258299 A1 | 10/2008 |
| WO | 03/015174 A2 | 2/2003 |
| WO | 2007/077666 A1 | 7/2007 |

OTHER PUBLICATIONS

Akira Endoh, et al., "*Non-Recessed-Gate Enhancement-Mode AlgaN/GaN High Electron Mobility Transistors with High RF Performance*," Japanese Journal of Applied Physics, vol. 43, No. 4B, 2004, pp. 2255-2258.

Yuji Ohmaki, et al., "*Enhancement-Mode AlGaN/AlN/GaN High Electron Mobility Transistor with Low On-State Resistance and High Breakdown Voltage*," Japanese Journal of Applied Physics, vol. 45, No. 44, 2006, pp. L168-L1170.

F. Medjdoub, et al., "*Can InAlN/GaN Be an Alternative to High Power/High Temperature AlGaN/GaN Devices?*," IEEE IEDM Tech. Digest, 2006, pp. 673-676.

F. Medjdoub, et al., "*Barrier Layer Downscaling of InAlN/GaN HEMTs*," Device Research Conference, 2007 65th Annual, Jun. 2007, pp. 109-110.

F. Medjdoub et al., "*Thermal Stability of 5 nm Barrier InAlN/GaN HEMTs*," International Semiconductor Devcie Research Symposium, Dec. 2007, pp. 1-2.

Takuma Nanjo et al., "*Remarkable Breakdown Voltage Enhancement in AlGaN Channel HEMTs*," International Electron Devices Meeting 2007, Dec. 2007, pp. 397-400.

J. Kuzmik, et al., "InAlN/GaN HEMTs: *A First Insight into Technological Optimization*," IEEE Trans. Elect. Dev., Mar. 2006, vol. 53, No. 3, pp. 422-426.

Erhard Kohn et al., "*InAlN—A New Barrier Material for GaN-Based HEMTs*," Physics of Semiconductor Devices, Dec. 16, 2007, IEEE, pp. 311-316.

R. Butte et al., "*Current Status of AlInN Layers Lattice-Matched to GaN for Photonics and Electronics*," Journal of Physics D: Applied Physics, IOP Publishing, vol. 40, No. 20, Oct. 21, 2007, pp. 6328-6344.

Extended European Search Report dated Jul. 17, 2012.

Chinese Office Action dated Jan. 28, 2013.

Stacia Keller, et al., "*Gallium Nitride Rased High Power Heterojunction Field Effect Transistors: Process Development and Present Status at USCB*," IEEE Trans. Electron Devices, vol. 48, No. 3, Mar. 2001, pp. 552-559.

U.S. Office Action (U.S. Appl. No. 12/884,516) dated May 6, 2013.

Japanese Office Action (related Application No. 2010-505540) dated Dec. 3, 2013.

Japanese Office Action (Application No. 2010-505541) dated Oct. 1, 2013.

A. Dadgar, et al., "*High-Sheet-Charge-Carrier-Density AlInN/GaN Field-Effect Transistors on Si*(111)," Applied Physics Letters, AIP, American Institute of Physics, Melville, NY, vol. 85, No. 22, Nov. 29, 2004, pp. 5400-5402.

K. Jeganathan, et al., "*Lattice-Matched InAlN/GaN Two-Dimensional Electron Gas with High Mobility and Sheet Carrier Density by Plasma-Assisted Molecular Beam Epitaxy*," Journal of Crystal Growth, Elsevier, Amsterdam, NL, vol. 304, No. 2, May 17, 2007, pp. 342-345.

Michihiko Kariya, et al., "*Mosaic Structure of Ternary Al 1-xInxN Films on GaN Grown by Metalorganic Vapor Phase Epitaxy*", Japanese Journal of Applied Physics, vol. 38, No. Part 2, No. 9A/B, Sep. 15, 1999, pp. 984-986.

Extended European Search Report (Application No. 09725966.7) dated Oct. 25, 2013.

European Office Action, European Application No. 09 725 966.7, dated May 12, 2014 (7 pages).

Tülek, Remziye, et al. "Comparison of the Transport Properties of High Quality AlGaN/AlN/GaN and AlInN/AlN/GaN two-dimensional Electron Gas Heterostructures," *Journal of Applied Physics*, vol. 105, No. 1, dated Jan. 7, 2009 (6 pages).

Japanese Office Action (Application No. 2010-505541) dated Apr. 22, 2014.

Japanese Office Action (Application No. 2013-240896) dated Aug. 5, 2014.

Japanese Office Action with a mailing date of Jul. 8, 2014 from a corresponding Japanese patent application.

Wang et al., 1-mm gate periphery AlGaN/AlN/GaN HEMTs on SiC with output power of 9.39 W at 8 GHz, ScienceDirect, Solid-State Electronics 51 (2007), pp. 428-432.

Japanese Decision of Rejection, Japanese Application No, 2010-505541, dated Sep. 2, 2014 (2 pages).

* cited by examiner

F I G . 1
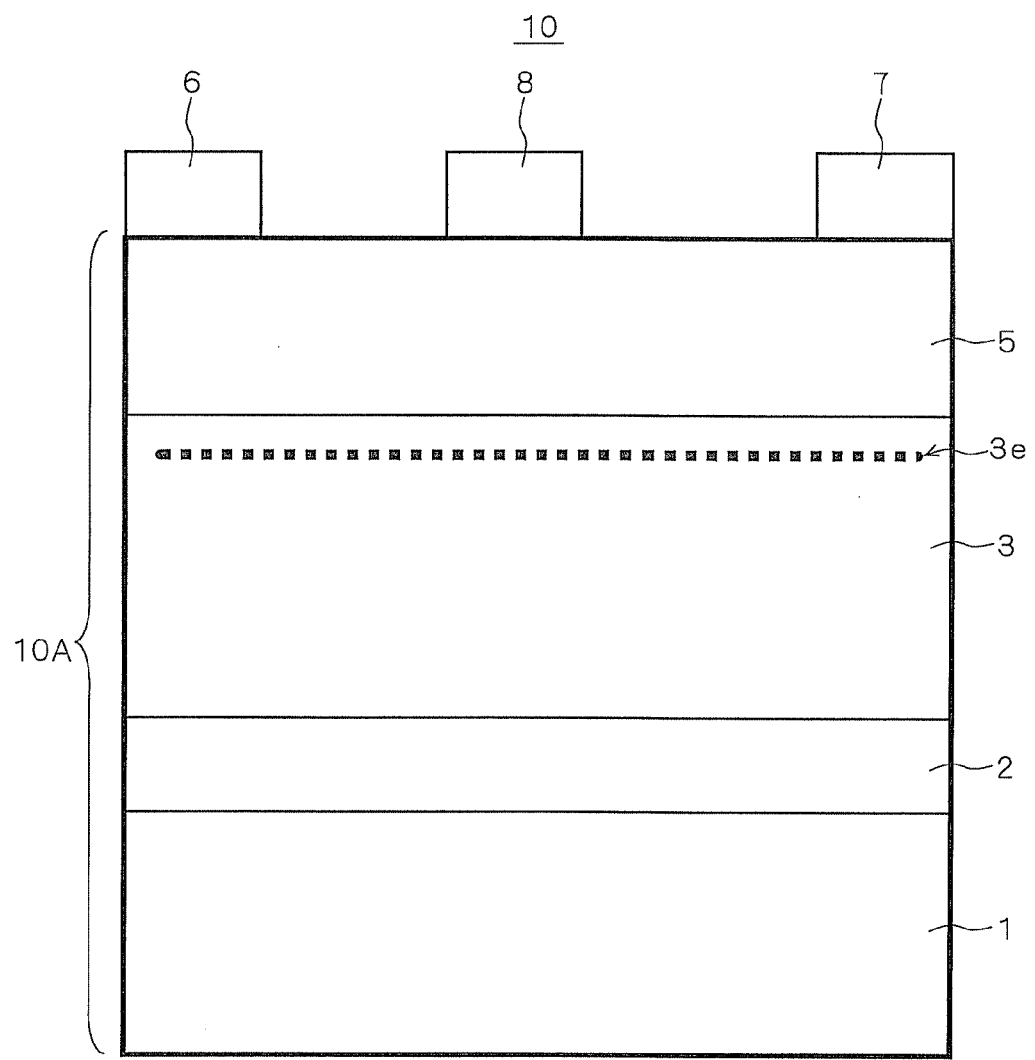

○ 2DEG CONCENTRATION EQUAL TO OR LARGER THAN $1e+13/cm^2$ AND POSITIVE THRESHOLD VOLTAGE
△ 2DEG CONCENTRATION LESS THAN $1e+13/cm^2$
✕ NEGATIVE THRESHOLD VOLTAGE

○ 2DEG CONCENTRATION EQUAL TO OR LARGER THAN
  1e+13/cm² AND POSITIVE THRESHOLD VOLTAGE
△ 2DEG CONCENTRATION LESS THAN 1e+13/cm²
✕ NEGATIVE THRESHOLD VOLTAGE

F I G . 4
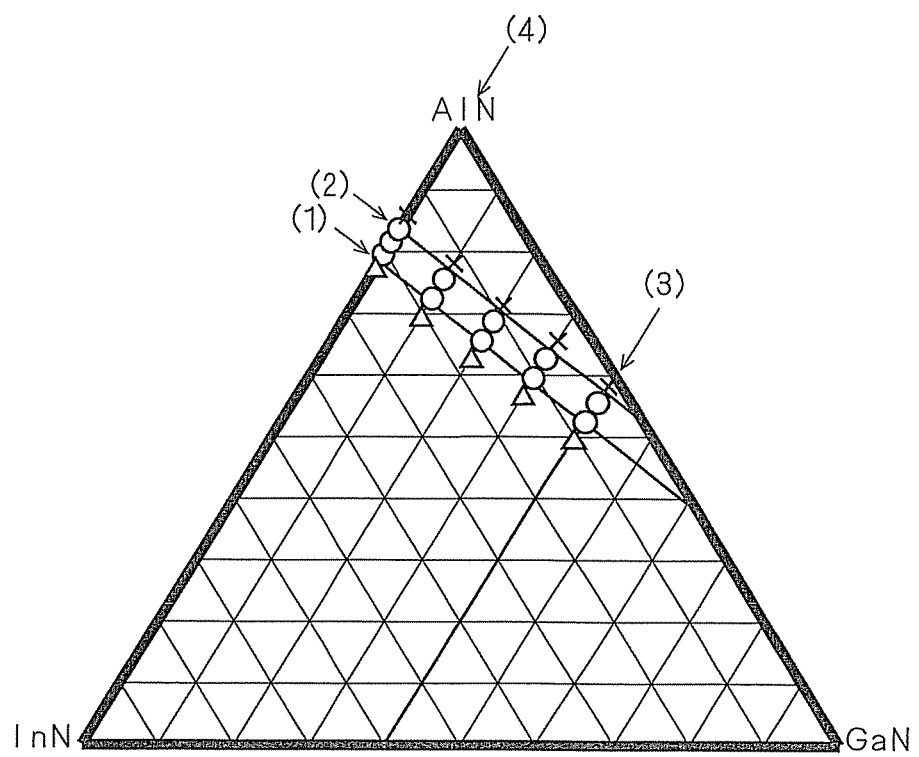
○ 2DEG CONCENTRATION EQUAL TO OR LARGER THAN
   1e+13/cm² AND POSITIVE THRESHOLD VOLTAGE
△ 2DEG CONCENTRATION LESS THAN 1e+13/cm²
✕ NEGATIVE THRESHOLD VOLTAGE ○ 2DEG CONCENTRATION EQUAL TO OR LARGER THAN
  1e+13/cm² AND POSITIVE THRESHOLD VOLTAGE
△ 2DEG CONCENTRATION LESS THAN 1e+13/cm²
✕ NEGATIVE THRESHOLD VOLTAGE F I G . 6
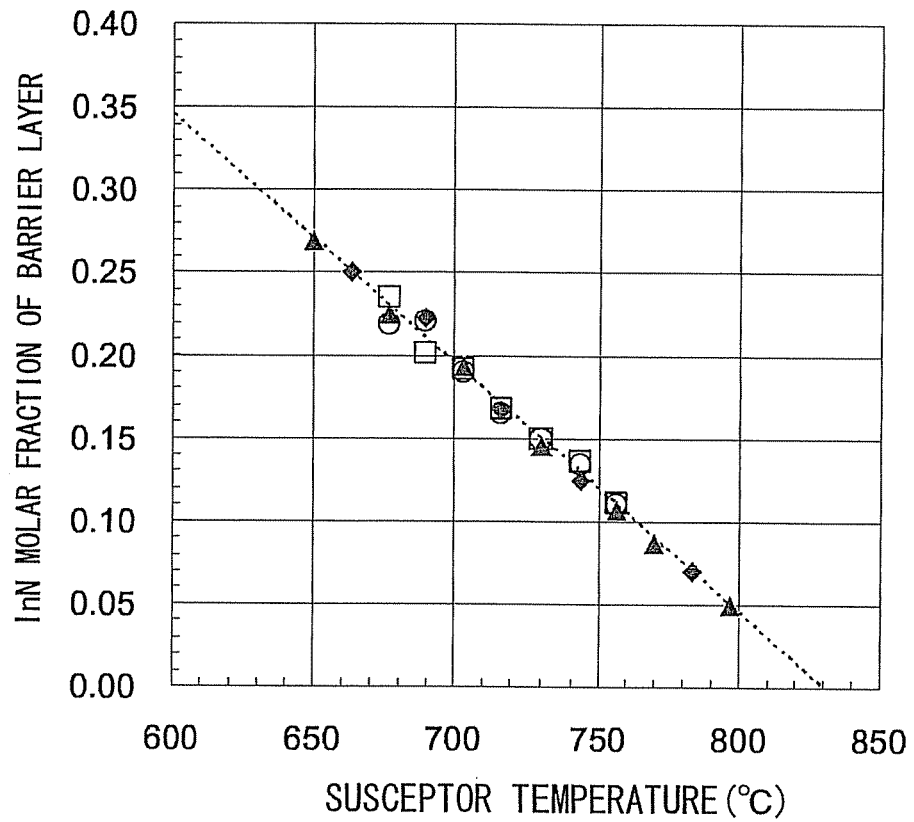

FIG. 8

| COMPOSITION OF CHANNEL LAYER | COMPOSITION OF BARRIER LAYER | SPACER LAYER | 2DEG MOBILITY (cm$^2$/Vs) |
|---|---|---|---|
| GaN | In$_{0.23}$Al$_{0.77}$N | Al$_{0.9}$Ga$_{0.1}$N (1nm$^t$) | 1255 |
| GaN | In$_{0.23}$Al$_{0.77}$N | AlN (1nm$^t$) | 1370 |
| GaN | In$_{0.19}$Al$_{0.71}$Ga$_{0.1}$N | AlN (1nm$^t$) | 1380 |
| Al$_{0.1}$Ga$_{0.9}$N | In$_{0.21}$Al$_{0.79}$N | AlN (1nm$^t$) | 1330 |
| Al$_{0.2}$Ga$_{0.8}$N | In$_{0.19}$Al$_{0.81}$N | AlN (1nm$^t$) | 1280 |
| Al$_{0.3}$Ga$_{0.7}$N | In$_{0.18}$Al$_{0.82}$N | AlN (1nm$^t$) | 1060 |

FIG. 10

| COMPOSITION OF CHANNEL LAYER | COMPOSITION OF BARRIER LAYER | 2DEG MOBILITY (cm$^2$/Vs) | FULL WIDTH AT HALF MAXIMUM OF X-RAY DIFFRACTION LINE (SECOND) | | SPECIFIC RESISTANCE OF CHANNEL LAYER (cm$^2$/Vs) | DRAIN LEAKAGE CURRENT ($\mu$A/mm) | OFF-STATE BREAKDOWN VOLTAGE (V) |
|---|---|---|---|---|---|---|---|
| | | | (0002) | (10-12) | | | |
| GaN | In$_{0.23}$Al$_{0.77}$N | 1370 | 100 | 300 | 1e+6 | 1 | 120 |
| Al$_{0.01}$Ga$_{0.99}$N | In$_{0.23}$Al$_{0.77}$N | 1370 | 100 | 300 | 1e+8 | 0.01 | 200 |
| Al$_{0.1}$Ga$_{0.9}$N | In$_{0.21}$Al$_{0.79}$N | 1330 | 150 | 380 | $\geq$1e+10 | $\leq$0.001 | 300 |
| Al$_{0.2}$Ga$_{0.8}$N | In$_{0.19}$Al$_{0.81}$N | 1280 | 220 | 450 | $\geq$1e+10 | $\leq$0.001 | 350 |
| Al$_{0.3}$Ga$_{0.7}$N | In$_{0.18}$Al$_{0.82}$N | 1060 | 350 | 650 | $\geq$1e+10 | $\leq$0.001 | 400 |

FIG. 11

| COMPOSITION OF CHANNEL LAYER | COMPOSITION OF BARRIER LAYER | METHOD OF MIXING HYDROGEN | 2DEG CONCENTRATION (cm-2) | CLASIFFICATION |
|---|---|---|---|---|
| GaN | $In_{0.19}Al_{0.71}Ga_{0.1}N$ | — | $1.1 \times 10^{13}$ | EXAMPLE 1 |
| | | PERFORM TMI BUBBLING WITH HYDROGEN | $< 2 \times 10^{11}$ | COMPARATIVE EXAMPLE 1 |
| | | PERFORM TMA BUBBLING WITH HYDROGEN | $< 2 \times 10^{11}$ | |
| | | SUBSTITUTE HYDROGEN FOR 10 FLOW RATE % of NH3 CARRIER GAS | $< 2 \times 10^{11}$ | |
| $Al_{0.1}Ga_{0.9}N$ | $In_{0.21}Al_{0.79}N$ | — | $1.2 \times 10^{13}$ | EXAMPLE 1 |
| | | PERFORM TMI BUBBLING WITH HYDROGEN | $< 2 \times 10^{11}$ | COMPARATIVE EXAMPLE 1 |
| | | PERFORM TMA BUBBLING WITH HYDROGEN | $< 2 \times 10^{11}$ | |
| | | SUBSTITUTE HYDROGEN FOR 10 FLOW RATE % of NH3 CARRIER GAS | $< 2 \times 10^{11}$ | |

FIG. 12

| COMPOSITION OF CHANNEL LAYER | COMPOSITION OF BARRIER LAYER | REACTOR PRESSURE (kPa) | 2DEG CONCENTRATION (×10$^{13}$/cm$^2$) | 2DEG MOBILITY (cm$^2$/Vs) | SURFACE MEAN SQUARE ROUGHNESS (nm) | CONTACT RESISTANCE (10$^{-5}$ Ω·cm$^2$) | GATE LEAKAGE CURRENT (μA/mm) |
|---|---|---|---|---|---|---|---|
| GaN | In$_{0.19}$Al$_{0.71}$Ga$_{0.1}$N | 1 | 1.1 | 1375 | 0.2 | 1.8 | 0.1 |
| | | 10 | 1.1 | 1380 | 0.3 | 1.8 | 0.1 |
| | | 20 | 1.1 | 1375 | 0.4 | 1.8 | 0.1 |
| | | 30 | 1.1 | 1365 | 1.1 | 4.8 | 0.5 |
| | | 50 | 0.4 | 920 | 4.5 | 12.0 | 5 |
| Al$_{0.1}$Ga$_{0.9}$N | In$_{0.21}$Al$_{0.79}$N | 1 | 1.2 | 1325 | 0.2 | 2.8 | 0.05 |
| | | 10 | 1.2 | 1330 | 0.2 | 2.8 | 0.05 |
| | | 20 | 1.2 | 1325 | 0.4 | 2.8 | 0.05 |
| | | 30 | 1.2 | 1320 | 1.2 | 5.2 | 0.1 |
| | | 50 | 0.4 | 930 | 5.7 | 18.0 | 2 |

F I G . 1 3

| COMPOSITION OF CHANNEL LAYER | COMPOSITION OF BARRIER LAYER | V/III GAS RATIO (kPa) | 2DEG CONCENTRATION (×10$^{13}$/cm$^2$) | 2DEG MOBILITY (cm$^2$/Vs) | SURFACE MEAN SQUARE ROUGHNESS (nm) | CONTACT RESISTANCE (10$^{-5}$ Ω·cm$^2$) | GATE LEAKAGE CURRENT (μA/mm) |
|---|---|---|---|---|---|---|---|
| GaN | In$_{0.19}$Al$_{0.71}$Ga$_{0.1}$N | 3000 | 1.1 | 1370 | 0.2 | 1.8 | 0.1 |
| | | 5000 | 1.1 | 1380 | 0.3 | 1.8 | 0.1 |
| | | 10000 | 1.1 | 1370 | 0.4 | 1.8 | 0.1 |
| | | 20000 | 1.1 | 1375 | 1.1 | 1.8 | 0.1 |
| Al$_{0.1}$Ga$_{0.9}$N | In$_{0.21}$Al$_{0.79}$N | 3000 | 1.2 | 1320 | 0.2 | 2.8 | 0.05 |
| | | 5000 | 1.2 | 1330 | 0.2 | 2.8 | 0.05 |
| | | 10000 | 1.2 | 1325 | 0.4 | 2.9 | 0.05 |
| | | 20000 | 1.2 | 1325 | 1.2 | 2.8 | 0.05 |

GROUP III NITRIDE EPITAXIAL SUBSTRATE FOR SEMICONDUCTOR DEVICE, SEMICONDUCTOR DEVICE, AND PROCESS FOR PRODUCING GROUP III NITRIDE EPITAXIAL SUBSTRATE FOR SEMICONDUCTOR DEVICE

TECHNICAL FIELD

The present invention relates to an epitaxial substrate that has a multi-layer structure composed of a group III nitride semiconductor, and more particularly, to a multi-layer structured epitaxial substrate for electronic devices and a method of manufacturing the same.

DESCRIPTION OF RELATED ART

Nitride semiconductors having high breakdown electric field and high saturation electron velocity have been attracting attention as the next generation of semiconductor materials for high-frequency/high-power devices. In particular, a multi-layer structure found by laminating layers formed of AlGaN and GaN has the feature that high-concentration two-dimensional electron gas (2DEG) is generated at a lamination interface (hetero interface) owing to a large polarization effect (spontaneous polarization effect and piezo polarization effect) inherent in a nitride material, and hence a high electron mobility transistor (HEMT) using the multi-layer structure as a substrate has been developed vigorously (for example, see "Highly Reliable 250 W High Electron Mobility Transistor Power Amplifier", Toshihide Kikkawa, Jpn. J. Appl. Phys. 44 (2005), p. 4896 (Non-Patent Document 1)).

In order to put the above-mentioned HEMT device or a substrate for HEMT device that is a multi-layer structure used in manufacturing the same to practical use, various problems need to be solved: problems related to performance improvement such as increase of power density and efficiency, problems related to functional improvement such as achieving normally-off operation, and fundamental problems such as enhancing reliability and reducing cost. The above-mentioned problems are individually tackled vigorously.

For example, in a case of a nitride HEMT device having the most typical configuration in which a channel layer is formed of GaN and a barrier layer is formed of AlGaN, there is proposed a method in which a threshold voltage is shifted to a value in a positive direction to achieve normally-off operation by, for example, a method of reducing a thickness of an AlGaN barrier layer (for example, see "Non-Recessed-Gate Enhancement-Mode AlGaN/GaN High Electron Mobility Transistors with High RF Performance", Akira ENDOH, Yoshimi YAMASHITA, Keiji IKEDA, Masataka HIGASHI-WAKI, Kohki HIKOSAKA, Toshiaki MATSUI, Satoshi HIYAMIZU and Takachi MIMURA, Japanese Journal of Applied Physics Vol. 43, No. 4B, 2004, pp. 2255-2258 (Non-Patent Document 2) or "Enhancement-Mode AlGaN/AlN/GaN High Electron Mobility Transistor with Low On-state Resistance and High Breakdown Voltage", Yuji OHMAKI, Masashi YAMAMOTO, Shiro AKAMATSU and Takashi MUKAI Japanese Journal of Applied Physics Vol. 45, No. 44, 2006, pp. L1168-L1170 (Non-Patent Document 3)).

Further, growing attention is also paid to the HEMT device that has a low dependence on the piezo polarization effect, is capable of generating two-dimensional electron gas at high concentration almost only by spontaneous polarization, and has the structure with small strains, such as the HEMT device in which a channel layer is formed of GaN and a barrier layer is formed of InAlN (for example, see "Can InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, p. 673 (Non-Patent Document 4)).

In the method of making a barrier layer formed of AlGaN thinner to shift a threshold voltage to be positive, as disclosed in ENDOH et al. or OHMAKI et al. above, the piezo effect is suppressed due to a thinner layer, which causes a problem that a sufficiently high two-dimensional electron gas concentration cannot be secured, which is approximately $5 \times 10^{12}/cm^2$ or less at most, and accordingly a device cannot have a low on-resistance.

Further, growing attention is paid to a laminated structure capable of obtaining higher two-dimensional electron gas concentration almost only by spontaneous polarization, as the InAlN/GaN heterostructure disclosed in Medjdoub et al. above. As to such laminated structure, for example, it is proposed to form a channel layer of GaN, form a barrier layer of $In_xAl_{1-x}N$ (x~0.18) having a composition that is lattice-matched to an a-axis of GaN, and further form a thin spacer layer of AlN between the channel layer and the barrier layer. However, the means for achieving the above in a specific manner and other effective configuration example are not expressly described because there is a large difference in growth temperature between InN and AlN, which makes it difficult to control epitaxial growth in a mixed crystal composition containing both. In addition, there have been found no descriptions on a normally-off device whose barrier layer is formed of $In_xAl_{1-x}N$ (x~0.18) having a composition lattice-matched to an a-axis of GaN or $In_xAl_{1-x}N$ having a peripheral composition thereof.

BRIEF SUMMARY OF THE INVENTION

The present invention has been made in view of the above-mentioned problems, and an object thereof is to provide an epitaxial substrate capable of achieving an electronic device that has excellent two-dimensional electron gas characteristics and an excellent surface form and operates in a normally-off mode.

In order to solve the above-mentioned problems, according to a first aspect of the present invention, in an epitaxial substrate including: a base substrate; a channel layer formed of a first group III nitride containing at least Al and Ga and having a composition of $In_{x1}Al_{y1}Ga_{z1}N$ (x1+y1+z1=1); and a barrier layer formed of a second group III nitride containing at least In and Al and having a composition of $In_{x2}Al_{y2}Ga_{z2}N$ (x2+y2+z2=1), the composition of the first group III nitride is in a range determined by x1=0 and 0≤y1≤0.3; the composition of the second group III nitride is, in a ternary phase diagram with InN, AlN and GaN being vertices, in a range surrounded by straight lines respectively represented by the following expressions determined in accordance with the composition of the first group III nitride; and the barrier layer has a thickness of 5 nm or less.

$$x2 = \frac{y2 - (0.27 + 0.5y1)}{1.78} = -\frac{z2 - (0.73 - 0.5y1)}{2.78} \quad \text{[Formula 1]}$$

$$x2 = \frac{y2 - (0.4 + 0.6y1)}{1.78} = -\frac{z2 - (0.6 - 0.6y1)}{2.78} \quad \text{[Formula 2]}$$

$$z2 = 0.4 \quad \text{[Formula 3]}$$

$$z2 = 0 \quad \text{[Formula 4]}$$

According to a second aspect of the present invention, the epitaxial substrate for semiconductor device according to the first aspect further includes a spacer layer formed of a third group III nitride having a composition of $In_{x3}Al_{y3}Ga_{z3}N$ (x3+y3+z3=1), the spacer layer being formed between the channel layer and the barrier layer, containing at least Al, and having larger bandgap energy compared with the barrier layer, wherein a total thickness of the spacer layer and the barrier layer is 5 nm or less.

According to a third aspect of the present invention, in the epitaxial substrate for semiconductor device according to the first or second aspect, the composition of the first group III nitride is in a range determined by $x1=0$ and $0<y1\leq 0.1$.

According to a fourth aspect of the present invention, in the epitaxial substrate for semiconductor device according to the first or second aspect, the composition of the first group III nitride is in a range determined by $x1=0$ and $0.1<y1\leq 0.3$.

According to a fifth aspect of the present invention, in the epitaxial substrate for semiconductor device according to the second aspect, the composition of the third group III nitride is in a range determined by $x3=0$ and $0\leq z3\leq 0.05$.

According to a sixth aspect of the present invention, in the epitaxial substrate for semiconductor device according to the fifth aspect, the third group III nitride is AlN.

According to a seventh aspect of the present invention, in a semiconductor device, a source electrode, a drain electrode and a gate electrode are provided on the barrier layer of the epitaxial substrate for semiconductor device according to any one of the first to sixth aspects.

According to an eighth aspect of the present invention, a method of manufacturing an epitaxial substrate for semiconductor device includes: a channel layer foaming step of epitaxially forming a channel layer formed of a first group III nitride on a base substrate, the first group III nitride containing at least Al and Ga and having a composition of $In_{x1}Al_{y1}Ga_{z1}N$ ($x1+y1+z1=1$); and a barrier layer forming step of epitaxially forming a barrier layer formed of a second group III nitride on the channel layer, the second group III nitride containing at least In and Al and having a composition of $In_{x2}Al_{y2}Ga_{z2}N$ ($x2+y2+z2=1$), wherein: the composition of the first group III nitride is selected in a range determined by $x1=0$ and $0\leq y1\leq 0.3$; and the composition of the second group III nitride is selected, in a ternary phase diagram with InN, AlN and GaN being vertices, in a range surrounded by straight lines respectively represented by the following expressions determined in accordance with the composition of the first group III nitride.

$$x2 = \frac{y2 - (0.27 + 0.5y1)}{1.78} = -\frac{z2 - (0.73 - 0.5y1)}{2.78} \quad \text{[Formula 5]}$$

$$x2 = \frac{y2 - (0.4 + 0.6y1)}{1.78} = -\frac{z2 - (0.6 - 0.6y1)}{2.78} \quad \text{[Formula 6]}$$

$$z2 = 0.4 \quad \text{[Formula 7]}$$

$$z2 = 0 \quad \text{[Formula 8]}$$

According to a ninth aspect of the present invention, in the method of manufacturing an epitaxial substrate for semiconductor device according to the eighth aspect, a temperature $T1(°C.)$ for forming the channel layer is determined in a range where $950°C.\leq T1\leq 1,250°C.$; and a temperature $T2(°C.)$ for forming the barrier layer is determined in a range determined in accordance with a molar fraction $x2$ of InN of the second group III nitride, the range satisfying $800-667\cdot x2(°C.)\leq T2\leq 860-667\cdot x2(°C.)$ and $600°C.\leq T2\leq 850°C.$ According to a tenth aspect of the present invention, in the method of manufacturing an epitaxial substrate for semiconductor device according to the eighth or ninth aspect, atmosphere gas other than source gas is nitrogen gas in the barrier layer forming step.

According to an eleventh aspect of the present invention, the method of manufacturing an epitaxial substrate for semiconductor device according to any one of the eighth to tenth aspects further includes a spacer layer forming step of forming, after the formation of the channel layer, a spacer layer formed of a third group III nitride having a composition of $In_{x3}Al_{y3}Ga_{z3}N$ ($x3+y3+z3=1$) on the channel layer, the third group III nitride containing at least Al and having larger bandgap energy compared with the barrier layer, wherein the barrier layer is formed on the spacer layer.

According to a twelfth aspect of the present invention, in the method of manufacturing an epitaxial substrate for semiconductor device according to the eleventh aspect, a temperature $T3(°C.)$ for forming the spacer layer in the spacer layer forming step is substantially equal to the temperature $T1(°C.)$ for forming the channel layer.

According to a thirteenth aspect of the present invention, in the method of manufacturing an epitaxial substrate for semiconductor device according to any one of the eighth to twelfth aspects, a pressure in a reactor is set to 1 kPa or more and 30 kPa or less in the barrier layer forming step.

According to a fourteenth aspect of the present invention, in the method of manufacturing an epitaxial substrate for semiconductor device according to the thirteenth aspect, the pressure in the reactor is set to 1 kPa or more and 20 kPa or less in the barrier layer forming step.

According to a fifteenth aspect of the present invention, in the method of manufacturing an epitaxial substrate for semiconductor device according to any one of the eighth to fourteenth aspects, a V/III ratio is set to 5,000 or more and 20,000 or less in the barrier layer forming step.

According to the first to fifteenth aspects of the present invention, there are achieved an epitaxial substrate capable of manufacturing a semiconductor device and the semiconductor device, the semiconductor device generating two-dimensional electron gas at a concentration of $1\times 10^{13}/cm^2$ or more, which is higher than conventional one, and being capable of performing normally-off operation.

Further, according to the second, fifth, sixth, eleventh and twelfth aspects of the present invention, there are achieved an epitaxial substrate capable of manufacturing a semiconductor device and the semiconductor device, the semiconductor device generating two-dimensional electron gas at high concentration, having high mobility, and being capable of performing normally-off operation.

In particular, according to the twelfth aspect of the present invention, the temperature is decreased to the barrier layer forming temperature after the formation of the spacer layer. Accordingly, the surface of the channel layer is prevented from becoming deteriorated due to temperature drop with the channel layer remaining exposed, which occurs in a case where the spacer layer is not provided.

Further, according to the third aspect of the present invention, there are achieved an epitaxial substrate capable of manufacturing a semiconductor device and the semiconductor device, the semiconductor device having high mobility and having small drain leakage current during OFF.

Further, according to the fourth aspect of the present invention, there are achieved an epitaxial substrate capable of manufacturing a semiconductor device and the semiconductor device, the semiconductor device having small drain leakage current during OFF and having high breakdown voltage.

Further, according to the ninth aspect of the present invention, by determining the barrier layer forming temperature in accordance with a target composition of the barrier layer, the barrier layer having the above-mentioned target composition can be formed without fail.

BRIEF DESCRIPTION OF DRAWINGS

FIG. 1 is a schematic cross-sectional view schematically showing a configuration of a HEMT device 10 according to a first embodiment.

FIG. 4 is a diagram in which the relationship between device characteristics and a composition of the barrier layer 5 when the channel layer 3 is $Al_{0.2}Ga_{0.8}N$ is mapped on a ternary phase diagram with three components of InN, AlN and GaN being vertices.

FIG. 6 is a diagram for describing how to determine a temperature range of a barrier layer forming temperature T2.

FIG. 8 is a figure showing, as an example, mobilities of the HEMT devices 20 having different compositions of a channel layer 3, a spacer layer 4 and a barrier layer 5.

FIG. 10 is a figure showing a list of measurement results of various characteristics of the HEMT devices 20 having different compositions of the channel layer 3 and the barrier layer 5.

FIG. 11 is a figure showing a list of two-dimensional electron gas concentrations of HEMT devices having different atmospheres for forming a barrier layer.

FIG. 12 is a figure showing a list of pressures in a reactor when the barrier layer is formed and various characteristics of manufactured HEMT devices.

FIG. 13 is a figure showing a list of V/III ratios when the barrier layer is formed and various characteristics of manufactured HEMT devices.

DETAILED DESCRIPTION OF THE INVENTION

First Embodiment (Configuration of HEMT Device)

Figure 2:
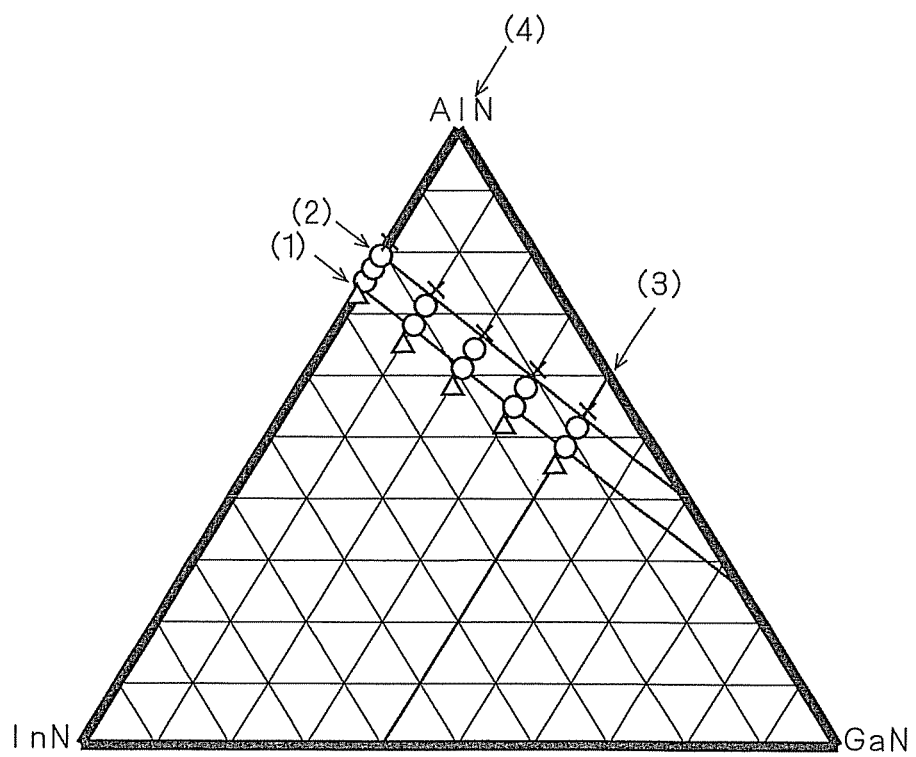
FIG. 2 is a diagram in which the relationship between device characteristics and a composition of a barrier layer 5 when a channel layer 3 is GaN is mapped on a ternary phase diagram with three components of InN, AlN and GaN being vertices.

FIG. 1 is a schematic cross-sectional view schematically showing the configuration of a HEMT device 10 according to a first embodiment of the present invention. The HEMT device 10 has the configuration in which a substrate 1, a buffer layer 2, a channel layer 3 and a barrier layer 5 are formed by lamination. The buffer layer 2, the channel layer 3 and the barrier layer 5 are preferred examples of layers that are epitaxially formed (details thereof are described below) using the metal organic chemical vapor deposition method (MOCVD method). Hereinbelow, the laminated structure fanned by laminating the substrate 1, the buffer layer 2, the channel layer 3 and the barrier layer 5 is also referred to as an epitaxial substrate 10A. Note that ratios of respective layers in FIG. 1 do not reflect actual ones.

Hereinbelow, while description is given of a case where the MOCVD method is used for the formation of each layer, other epitaxial growth technique, for example, the method appropriately selected from various vapor phase growth methods and liquid phase growth methods such as MBE, HVPE and LPE may be used, as long as it is the technique capable of forming each layer for providing excellent crystallinity. Alternatively, different growth methods may be used in combination.

Any substrate may be used as the substrate 1 as long as a nitride semiconductor layer having excellent crystallinity can be foamed thereon, without any particular limitation. A 6H—SiC single crystal substrate is preferably used as an example, and a substrate composed of sapphire, Si, GaAs, spinel, MgO, ZnO, ferrite or the like may be used.

The buffer layer 2 is formed of AlN to have a thickness of approximately several hundreds of nm, for making crystal quality of the channel layer 3 and the barrier layer 5 that are formed thereon excellent. For example, the buffer layer 2 is preferably formed to have a thickness of 200 nm.

The channel layer 3 is formed of a group III nitride having a composition of $In_{x1}Al_{y1}Ga_{z1}N$ (x1+y1+z1=1) so as to have a thickness of approximately several μm. In this embodiment, the channel layer 3 is formed so as to satisfy a composition range of x1=0 and 0≤y1≤0.3. In the case where 0.3<y1≤1, the crystallinity of the channel layer 3 itself deteriorates remarkably, which makes it difficult to obtain the epitaxial substrate 10A and besides, the HEMT device 10 having excellent electrical characteristics.

On the other hand, the barrier layer 5 is formed of a group III nitride having a composition of $In_{x2}Al_{y2}Ga_{z2}N$ (where x2+y2+z2=1) so as to have a thickness of 5 nm or less. When the barrier layer is caused to be in the above-mentioned thickness range, high two-dimensional electron gas concentration and normally-off operation can be compatible with each other.

In the HEMT device 10, a source electrode 6, a drain electrode 7 and a gate electrode 8 are further provided on the barrier layer 5. The source electrode 6 and the drain electrode 7 are multi-layer metal electrodes formed of Ti/Al/Ni/Au each having thickness of approximately ten and several nm to hundred and several tens of nm. The source electrode 6 and the drain electrode 7 have ohmic contact with the bather layer 5. On the other hand, the gate electrode 8 is a multi-layer metal electrode formed of Pd/Au each having thickness of approximately ten and several nm to hundred and several tens of nm. The gate electrode 8 has Schottky contact with the barrier layer 5. Note that the metal used for the source electrode 6 and the drain electrode 7 is not limited to the multi-layer metal formed of Ti/Al/Ni/Au as long as excellent ohmic contact can be obtained with respect to the semiconductor epitaxial substrate according to the present invention and, for example, Ti/Al/Pt/Au or Ti/Al can be used. Similarly, the metal used for the gate electrode 8 is not limited to Pd/Au as long as excellent Schottky contact can be obtained with respect to the semiconductor epitaxial substrate according to the present invention and, for example, Pd/Ti/Au or Ni/Au can be used.

In the HEMT device 10 having the above-mentioned layer configuration (in the epitaxial substrate 10A), an interface between the channel layer 3 and the barrier layer 5 becomes a heterojunction interface, and thus a two-dimensional electron gas region 3e in which two-dimensional electron gas is present at high concentration is formed at the interface (more specifically, at the portion of the channel layer 3 in the vicinity of the interface) by the spontaneous polarization effect and piezo polarization effect. Note that in order to generate the two-dimensional electron gas, the formation is made such that the interface has the mean roughness within a range of 0.1 nm to 3 nm and a surface of the barrier layer 5 for forming this has the mean square roughness within a range of 0.1 nm to 3 nm. Note that a flat interface may be formed exceeding the above-mentioned range, which is not practical considering cost and manufacturing yield. Preferably, the formation is made such that has the mean roughness is within a range of 0.1 nm to 1 nm and the mean square roughness within a range 0.1 nm to 1 nm. In such a case, more excellent ohmic characteristics are obtained between the source electrode 6 or the drain electrode 7 and the barrier layer 5, and more excellent Schottky characteristics are obtained between the gate electrode 8 and the barrier layer 5. Moreover, the effect of confining two-dimensional electron gas is enhanced further, whereby two-dimensional electron gas having higher concentration is generated.

In this embodiment, when the compositions of the group III nitride constituting the channel layer 3 and the barrier layer 5 are caused to satisfy a predetermined requirement, there can be achieved the HEMT device 10 that includes the two-dimensional electron gas region 3e in which two-dimensional electron gas is present at a higher concentration compared with a conventional case and is capable of performing normally-off operation. Specifically, two-dimensional electron gas concentration of $1 \times 10^{13}/cm^2$ or more is achieved, which is described below in detail. Note that the mobility of two-dimensional electron gas in the HEMT device 10 is approximately 300 to 400 cm$^2$/Vs.

(Relationship Between Compositions of Channel Layer and Barrier Layer and Device Characteristics)

Figure 3:
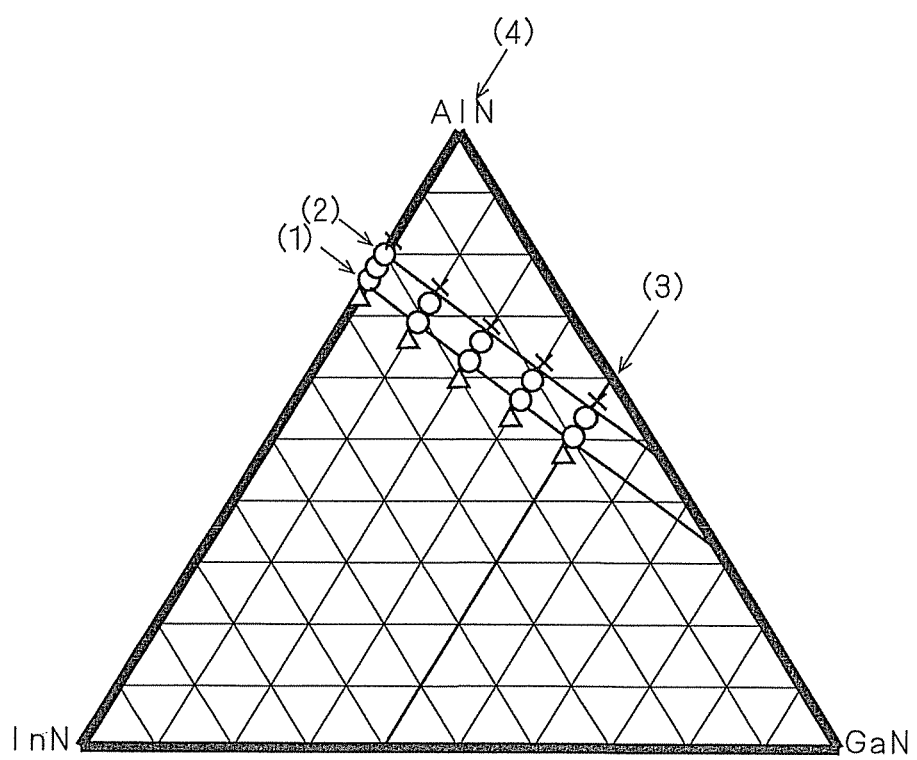
FIG. 3 is a diagram in which the relationship between device characteristics and a composition of the barrier layer 5 when the channel layer 3 is $Al_{0.1}Ga_{0.9}N$ is mapped on a ternary phase diagram with three components of InN, AlN and GaN being vertices.
Figure 5:
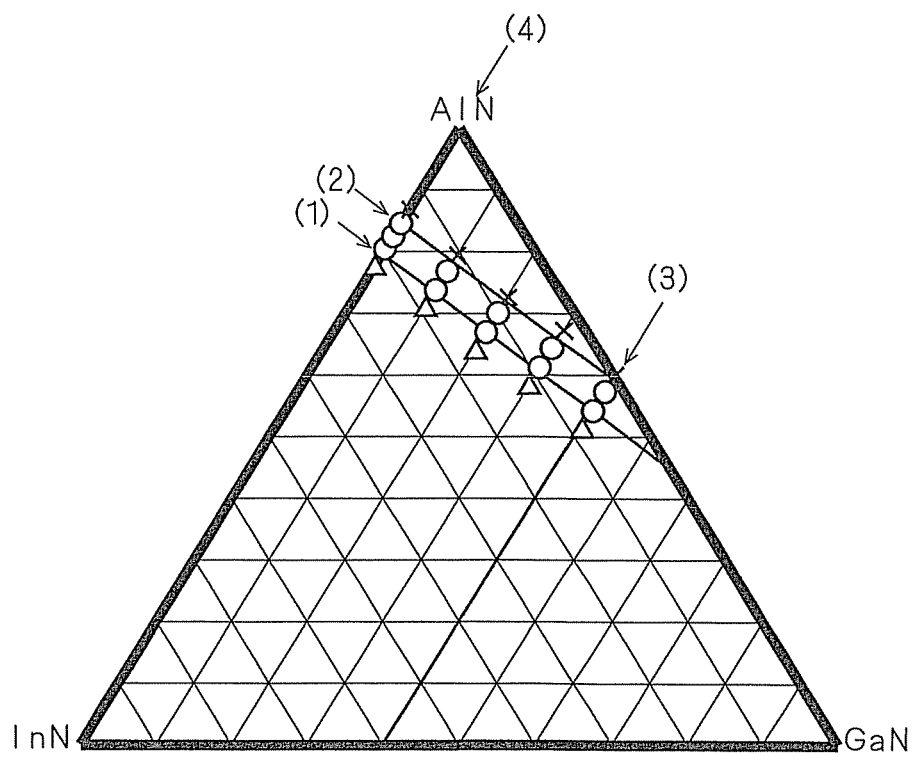
FIG. 5 is a diagram in which the relationship between device characteristics and a composition of the barrier layer 5 when the channel layer 3 is $Al_{0.3}Ga_{0.7}N$ is mapped on a ternary phase diagram with three components of InN, AlN and GaN being vertices.

FIG. 2, FIG. 3, FIG. 4 and FIG. 5 are diagrams in which the relationship between a two-dimensional electron gas concentration besides a threshold voltage and a composition of the barrier layer 5 of a plurality of HEMT devices 10, which were manufactured by fixing the composition of the cannel layer 3 and changing the composition of the barrier layer 5, is mapped on a ternary phase diagram with three components of InN, AlN and GaN being vertices. The compositions of the channel layer 3 corresponding to the respective diagrams are as follows:

FIG. 2: GaN (x1=y1=0, z1=1);
FIG. 3: Al$_{0.2}$Ga$_{0.9}$N (x1=0, y1=0.1, z1=0.9);
FIG. 4: Al$_{0.2}$Ga$_{0.8}$N (x1=0, y1=0.2, z1=0.8); and
FIG. 5: Al$_{0.3}$Ga$_{0.7}$N (x1=0, y1=0.3, z1=0.7).

Mapping results shown in FIG. 2 to FIG. 5 lead to a fact that when the barrier layer 5 selects the composition in the range surrounded by four straight lines represented by the expressions described below in the ternary phase diagrams, the two-dimensional electron gas concentration in the two-dimensional electron gas region 3e is equal to or more than $1 \times 10^{13}/cm^2$ and the threshold voltage is 0 V or more.

[Formula 9]
$$x2 = \frac{y2 - (0.27 + 0.5y1)}{1.78} = -\frac{z2 - (0.73 - 0.5y1)}{2.78} \quad (1)$$

[Formula 10]
$$x2 = \frac{y2 - (0.4 + 0.6y1)}{1.78} = -\frac{z2 - (0.6 - 0.6y1)}{2.78} \quad (2)$$

[Formula 11]
$$z2 = 0.4 \quad (3)$$

[Formula 12]
$$z2 = 0 \quad (4)$$

Expressions (1) and (2) include the composition of the channel layer 3 (specifically, value of y1 when x1=0) as a variable, which means that the composition of the barrier layer 5 in which a high two-dimensional electron gas concentration of $1 \times 10^{13}/cm^2$ or more and a threshold voltage of 0 V or more are compatible with each other is determined in accordance with the composition of the channel layer 3.

The above indicates that, in the HEMT device 10 in which the channel layer 3 and the barrier layer 5 are formed with the composition satisfying the above-mentioned composition range, the two-dimensional electron gas region 3e having a concentration of $1 \times 10^{13}/cm^2$ or more that is higher compared with a conventional case is formed at the interface between both layers, and the normally-off operation is achieved.

Note that the discussion regarding the above-mentioned composition range does not exclude a fact that the channel layer 3 and the barrier layer 5 contain impurities. For example, the channel layer 3 and the barrier layer 5 may contain oxygen atoms in the concentration range of 0.0005 at % ($1 \times 10^{17}/cm^3$) or more to 0.05 at % ($1 \times 10^{19}/cm^3$) or less, or may contain carbon atoms in the concentration range of 0.0010 at % ($2 \times 10^{17}/cm^3$) or more to 0.05 at % ($1 \times 10^{19}/cm^3$) or less. Note that the concentrations of oxygen atoms and carbon atoms may be smaller than respective lower limits of the above-mentioned ranges, which is not practical considering cost and manufacturing yield. On the other hand, when the concentrations of oxygen atoms and carbon atoms exceed respective upper limits of the above-mentioned ranges, the crystallinity of each layer deteriorates to such an extent that device characteristics deteriorate, which is not desirable.

(Relationship Between Composition of Channel Layer and Device Characteristics)

As described above, the channel layer 3 is formed so as to satisfy the composition range where x1=0 and 0≤y1≤0.3, and in a case where the channel layer 3 is formed so as to satisfy the composition range where x1=0 and 0.01≤y1≤0.1, there is achieved a HEMT device in which the mobility of two-dimensional electron gas is high and the drain leakage current during OFF is small. On the other hand, in a case where the channel layer 3 is formed so as to satisfy the composition range where x1=0 and 0.1≤y1≤0.3, there is achieved a HEMT device having a small drain leakage current during OFF and a high breakdown voltage. This is described more specifically in the second embodiment in which higher mobility is achieved.

(Manufacturing Method for Epitaxial Substrate and HEMT Device)

Next, description is given of the method of manufacturing the epitaxial substrate 10A in which the above-mentioned channel layer 3 and barrier layer 5 have the above-mentioned composition ranges and further manufacturing the HEMT device 10 using the epitaxial substrate 10A.

Note that the case where a large number of HEMT devices 10 are manufactured at the same time from one substrate 1 (in a case where a large number of pieces are manufactured) is described below.

The epitaxial substrate 10A can be manufactured with a known MOCVD apparatus. Specifically, there is used an MOCVD apparatus configured such that a reactor is capable of being supplied with a metal organic (MO) source gas (TMI, TMA and TMG) for In, Al and Ga, an ammonia gas, a hydrogen gas and a nitrogen gas.

First, for example, a 6H—SiC substrate that has (0001) plane orientation and a diameter of two inches is prepared as the substrate 1, and the substrate 1 is placed on a susceptor provided in the reactor of the MOCVD apparatus. The inside of the reactor is vacuumed, and then, an atmosphere in hydrogen/nitrogen mixed flow state is formed while maintaining a pressure inside the reactor at a predetermined value of 5 kPa to 50 kPa (for example, 30 kPa). After that, the temperature of the substrate is raised through susceptor heating.

When the susceptor temperature reaches a predetermined temperature of 950° C. to 1,250° C. (for example, 1,050° C.), which is a buffer layer forming temperature, Al source gas and $NH_3$ gas are introduced into the reactor, to thereby form an MN layer serving as the buffer layer 2.

After the AlN layer is formed, the susceptor temperature is maintained at a predetermined channel layer forming temperature $T1(° C.)$, and metal organic source gas and ammonia gas are introduced into the reactor in accordance with the composition of the channel layer 3, thereby forming an $In_{x1}Al_{y1}Ga_{z1}N$ layer (where x1=0, 0≤y1≤0.3) serving as the channel layer 3. Here, the channel layer forming temperature T1 is a value determined in the temperature range where 950° C.≤T1≤1,250° C. in accordance with a value of an AlN molar fraction y1 of the channel layer 3. Note that the pressure in the reactor when forming the channel layer 3 is not particularly limited, and can be appropriately selected from the range of 10 kPa to an atmospheric pressure (100 kPa).

After the $In_{x1}Al_{y1}Ga_{z1}N$ layer is formed, next, the susceptor temperature is maintained at a predetermined barrier layer forming temperature $T2(° C.)$, and then a nitrogen gas atmosphere is formed in the reactor. On that occasion, the pressure in the reactor is maintained at a predetermined value of 1 kPa to 30 kPa (for example, 10 kPa). Note that in the case where the pressure in the reactor is set to a predetermined value of 1 kPa to 20 kPa, the HEMT device 10 that has a small ohmic contact resistance and a small gate leakage current (excellent Schottky contact characteristics) is achieved. This is the effect resulting from the increased surface flatness of the barrier layer 5 owing to a reduced reactor pressure.

Next, ammonia gas and metal organic source gas that has a flow rate corresponding to the composition of the barrier layer 5 are introduced into the reactor such that a so-called V/III ratio takes a predetermined value of 3,000 or more and 20,000 or less, and then the $In_{x2}Al_{y2}Ga_{z2}N$ layer serving as the barrier layer 5 is formed to have a predetermined thickness. The $In_{x2}Al_{y2}Ga_{z2}N$ layer is formed so as to have the composition that satisfies Expression (1) to Expression (4). Note that the range of the growth rate of the barrier layer 5 is preferably 0.01 to 0.1 μm/h.

Note that in the case where the V/III ratio is a predetermined value in the range of 3,000 or more to 7,500 or less, the formation is made such that the interface between the channel layer 3 and the barrier layer 5 has the mean roughness in the range of 0.1 nm to 1 nm and the surface of the barrier layer 5 has the mean square roughness in the range of 0.1 nm to 1 nm in a field of view of 5 μm×5 μm.

Here, the barrier layer forming temperature $T2(° C.)$ is determined is in a range of 650° C. or more to 800° C. or less and in a temperature range of 800−667·x2(° C.)≤T2≤860−667·x2(° C.) that is determined in accordance with the InN molar fraction x2 of the bather layer 5.

FIG. 6 is a figure for describing that the bather layer forming temperature T2 is determined in the above-mentioned temperature range. That is, FIG. 6 is a diagram in which InN molar fractions x2 of the barrier layer 5 are plotted with respect to the susceptor temperature in a case where a ratio of a flow amount of 1n source gas (hereinbelow, In flow rate) to a flow amount of the entire metal organic source gas is changed in a range of 0.5 or more to 0.8 or less and the susceptor temperature in forming a bather layer (equivalent to the barrier layer forming temperature T2) is changed. Note that the V/III ratio is 5,000.

FIG. 6 reveals that data points are positioned on substantially the same straight line irrespective of the In flow rate. This indicates that the relationship of linear function is substantially established between the barrier layer forming temperature T2 and the InN molar fraction x2. There is no dependence on the InN flow rate, and thus according to the above-mentioned functional relation, it is concluded that the InN molar fraction of the barrier layer can be controlled by the barrier layer forming temperature T2 (susceptor temperature). That is, it is possible to form the barrier layer 5 having an aimed composition.

Specifically, from an arrangement state of the data points in FIG. 6, a regression line represented by the equation T2=830−667·x2 is derived. Therefore, in principle, the barrier layer forming temperature T2 can be determined from the equation above when a desired InN molar fraction x2 is determined. Even in consideration of variations generated by a difference between solid bodies of an MOCVD apparatus or a heating member used in heating, the barrier layer 5 having a desired InN molar fraction x2 can be formed without fail by selecting a preferred temperature in a range of ±30° C. from the equation above. That is, when the relationship of 800−667·x2(° C.)≤T2≤860−667·x2(° C.) is satisfied, the barrier layer 5 can be formed so as to have excellent controllability in a wide composition range, for example, in the composition range determined by Expression (1) to Expression (4) above.

Further, in this embodiment, nitrogen gas is used for bubbling gas of metal organic source and carrier gas in manufacturing the barrier layer 5. That is, the atmosphere gas other than source gas is only nitrogen gas. Accordingly, the hydrogen-terminated dangling bond can be made nitrogen-terminated, and an electron structure of the barrier layer 5 can be maintained in an ideal state, with the result that the generation of two-dimensional electron gas is achieved at high concentration in the two-dimensional electron gas region 3e. Note that it is not preferable to intentionally mix hydrogen gas into the atmosphere in manufacturing the barrier layer 5 because this causes a decrease in concentration of two-dimensional electron gas.

Manufacturing of the epitaxial substrate 10A is completed after the formation of the barrier layer 5.

After the epitaxial substrate 10A is obtained, the HEMT device 10 is manufactured using this. Note that the steps thereafter are achieved by a known technique.

First, the device isolation step of removing portions that become boundaries between respective devices by etching is performed so as to have a depth of approximately 400 nm by the photolithography process and the RIE method. This device isolation step is required for obtaining a large number of HEMT devices 10 from one epitaxial substrate 10A, which is not necessary for the present invention inherently.

After the device isolation step is performed, an $SiO_2$ film is formed on the epitaxial substrate 10A to have a predetermined thickness (for example, 10 nm), and then by the photolithography process, the $SiO_2$ film only in the positions where the source electrode 6 and the drain electrode 7 are to be formed is removed by etching, thereby forming an $SiO_2$ pattern layer.

After the formation of the $SiO_2$ pattern layer, the source electrode 6 and the drain electrode 7 formed of Ti/Al/Ni/Au are respectively formed in the expected formation positions thereof by the vacuum deposition method and the photolithography process. Then, in order to obtain excellent ohmic characteristics of the source electrode 6 and the drain electrode 7, heat treatment is performed for several tens of seconds (for example, 30 seconds) in the nitrogen gas atmosphere at a predetermined temperature of 650° C. to 1,000° C. (for example, 850° C.).

After the heat treatment, the $SiO_2$ film in the position where the gate electrode 8 is to be formed is removed from the $SiO_2$ pattern layer by the photolithography process, and then the gate electrode 8 formed of Pd/Au is formed in the expected formation position by the vacuum deposition method and the photolithography process. The gate electrode 8 is formed as a Schottky metal pattern.

The HEMT device 10 is obtained by removing the left $SiO_2$ pattern layer through the photolithography process.

As described above, according to this embodiment, the channel layer is formed so as to satisfy the composition range of $In_{x1}Al_{y1}Ga_{z1}N$ (where $x1+y1+z1=1$, $x1=0$, $0 \le y1 \le 0.3$), and the epitaxial substrate is manufactured by determining the composition of the barrier layer so as to satisfy the composition range determined by Expression (1) to Expression (4), whereby with the use of this, there is achieved a HEMT device capable of performing normally-off operation in which a two-dimensional electron gas region having a concentration of $1 \times 10^{13}/cm^2$ or more, which is higher compared with a conventional case. Further, the barrier layer that satisfies the above-mentioned composition range is formed under the nitrogen gas atmosphere by preferably determining a pressure and a V/III ratio and setting the forming temperature to a value in a predetermined range corresponding to a molar fraction of InN.

Second Embodiment (HEMT Device Including Spacer Layer)

Figure 7:
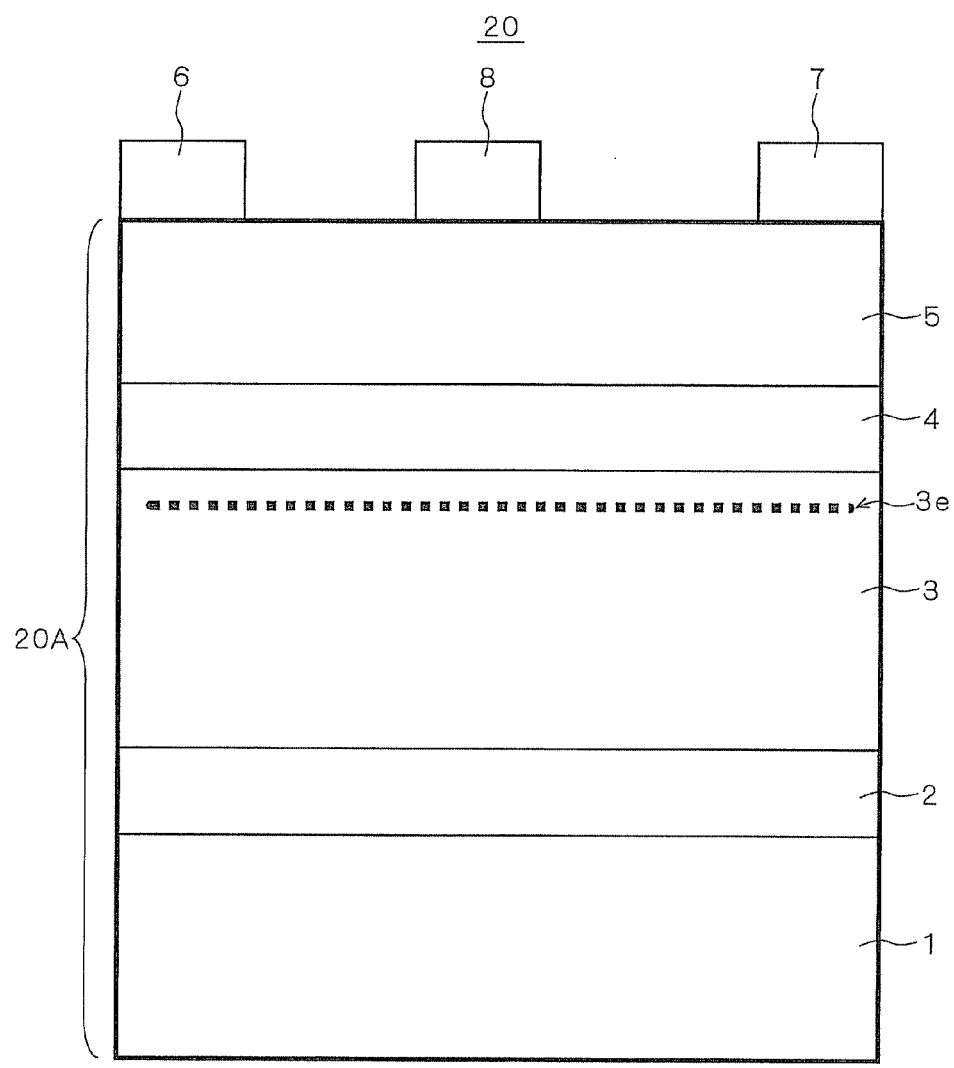
FIG. 7 is a schematic cross-sectional view schematically showing a configuration of a HEMT device 20 according to a second embodiment.

FIG. 7 is a schematic cross-sectional diagram schematically showing the configuration of a HEMT device 20 according to a second embodiment of the present invention. The HEMT device 20 has the configuration in which a spacer layer 4 is interposed between the channel layer 3 and the barrier layer 5 of the HEMT device 10 according to the first embodiment. Constituent elements other than the spacer layer 4 are the same as those of the HEMT device 10 according to the first embodiment, and thus detailed description thereof is omitted. Note that the laminated structure in which the substrate 1, the buffer layer 2, the channel layer 3, the spacer layer 4 and the barrier layer 5 are formed by lamination is also referred to as an epitaxial substrate 20A.

The spacer layer 4 is formed of a group III nitride that has a composition of $In_{x3}Al_{y3}Ga_{z3}N$ ($x3+y3+z3=1$), contains at least Al, and has a bandgap equal to or larger than the bandgap of the bather layer 5 to have a thickness in a range of 0.5 nm to 1.5 nm such that a total thickness of the spacer layer 4 and the barrier layer 5 is equal to or less than 5 nm. For example, in a case where the spacer layer 4 is formed such that $x3=0$ and $0 \le z3 \le 0.2$, the spacer layer 4 that has a bandgap larger than any bather layer 5 determined by Equations (1) to (4) is formed. The spacer layer 4 is preferably formed such that $x3=0$ and $0 \le z3 \le 0.05$. In such a case, an alloy scattering effect is suppressed, and the concentration and mobility of two-dimensional electron gas are improved. The spacer layer 4 is more preferably formed of AlN ($x3=0$, $y3=1$, $z3=0$). In such a case, the spacer layer 4 is a binary compound of Al and N, and thus an alloy scattering effect is suppressed further compared with the case of a ternary compound containing Ga, with the result that the concentration and mobility of two-dimensional electron gas are improved.

Note that the discussion regarding the above-mentioned composition range does not exclude the fact that the spacer layer 4 contains impurities. For example, in the case where the channel layer 3 contains oxygen atoms or nitrogen atoms in the concentration range as described above, the spacer layer 4 may contain those in a similar concentration range as well.

As described above, in the HEMT device 20 including the spacer layer 4, the two-dimensional electron gas region 3e in which two-dimensional electron gas is present at high concentration is formed at the interface between the channel layer 3 and the spacer layer 4 (more specifically, in the portion of the channel layer 3 in the vicinity of the interface). If the composition ranges of the channel layer 3 and the barrier layer 5 of the HEMT device 20 are determined in the same manner as the HEMT device 10 according to the first embodiment, two-dimensional electron gas equal to that of the HEMT device 10 having the corresponding composition is generated also in the two-dimensional electron gas region 3e of the HEMT device 20.

Further, in the HEMT device 20 including the above-mentioned spacer layer 4, the mobility higher than that of the HEMT device 10 according to the first embodiment is achieved. FIG. 8 is a figure showing, as an example, mobilities of the HEMT devices 20 having different compositions of the channel layer 3, the spacer layer 4 and the barrier layer 5. Note that the thickness of each of the spacer layers 4 is 1 nm. In the HEMT device 20, including the case shown in FIG. 8, the mobility of approximately 1,000 to 1,400 $cm^2/Vs$, which is three times or more larger than that of the HEMT device 10, is achieved.

Figure 9:
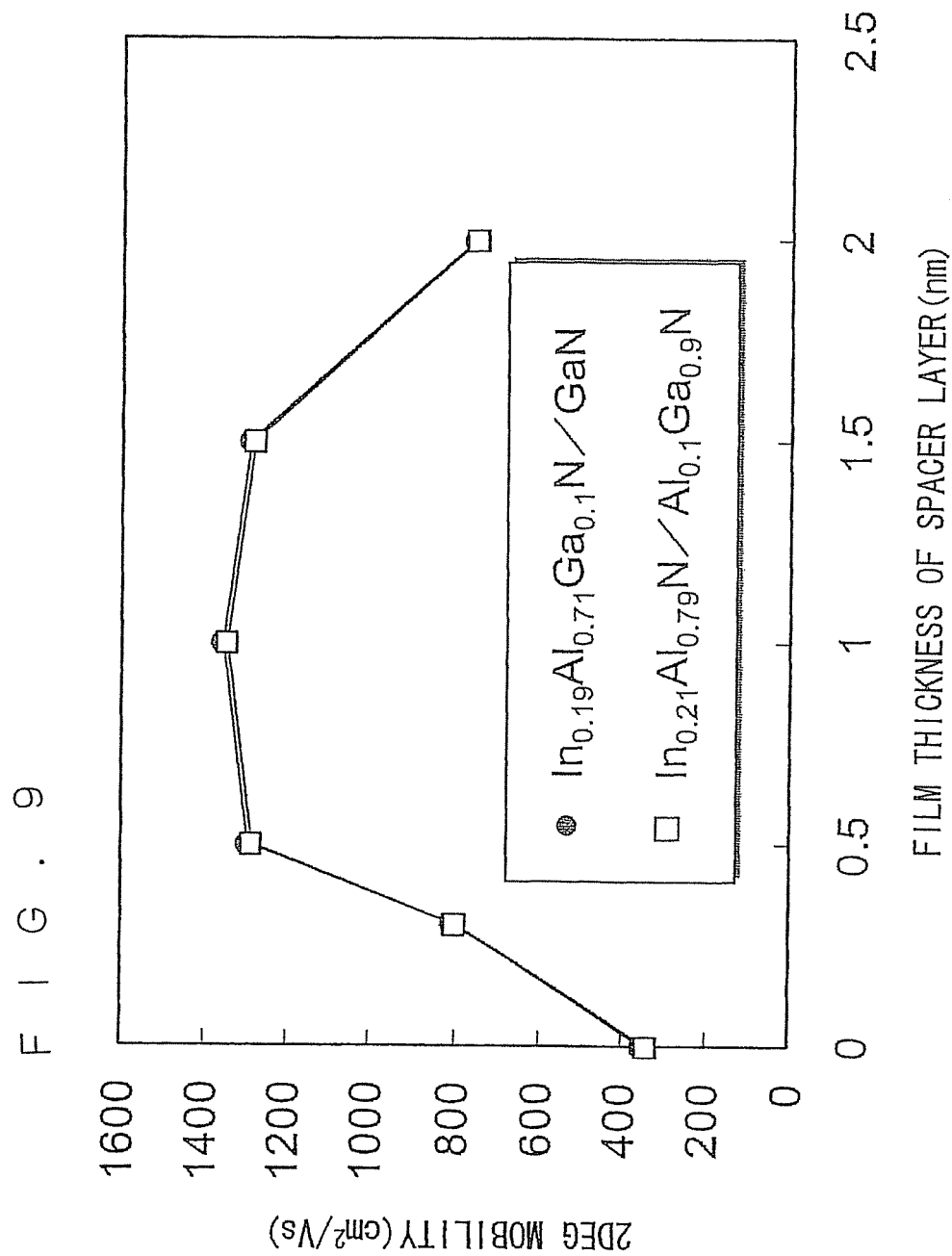
FIG. 9 is a figure showing, as an example, the relationship between a film thickness of the spacer layer 4 and the mobility of the HEMT device 20.

FIG. 9 is a figure showing, as an example, the relationship between the film thickness of the spacer layer 4 and the mobility of the HEMT device 20. Note that a case where the film thickness of the spacer layer 4 is zero is equivalent to the case where the spacer layer is not provided, that is, the first embodiment. FIG. 9 reveals that high mobility is obtained in the case where the spacer layer 4 is formed to have a thickness of 0.5 nm to 1.5 nm as described above. It is considered that in a case where the spacer layer 4 is formed to have a thickness less than 0.5 nm, the layer is insufficiently formed and an effect of confining two-dimensional electron gas is not sufficiently obtained, and that in a case where the spacer layer 4 is formed to have a thickness larger than 1.5 nm, the film quality of the spacer layer 4 itself becomes deteriorated due to an internal stress.

Further, FIG. 10 is a figure showing a list of results obtained by measuring the mobility of two-dimensional electron gas, full widths at half maximum of peaks of a (0002) plane and a (10-12) plane in an X-ray diffraction profile, a specific resistance of the channel layer 3, a drain leakage current and an off-state breakdown voltage of the HEMT devices 20 in which the compositions of the channel layer 3 and the barrier layer 5 are changed and the spacer layer 4 is formed of AlN to have a thickness of 1 nm.

As can be seen from FIG. 10, in a case where the channel layer 3 contains even a slight amount of Al (in a case where y1>0), a specific resistance thereof increases abruptly and the drain leakage current during OFF decreases abruptly. For example, compared with the case where y1=0 (in which the channel layer 3 is GaN), the specific resistance increases by approximately two orders and drain leakage current decreases by approximately two orders in a case where y1=0.01 (in which the channel layer 3 is $Al_{0.01}Ga_{0.99}N$). Moreover, in a case where y1=0.1 (in which the channel layer 3 is $Al_{0.1}Ga_{0.9}N$), the specific resistance increases by approximately four orders and the drain leakage current decreases by approximately three orders compared with the case where y1=0.

On the other hand, the mobility of two-dimensional electron gas hardly changes in a range where $0 \leq y1 \leq 0.1$. This is considered to result from the fact that the crystallinity of the channel layer does not deteriorate significantly along with an increase in AlN molar fraction and the fact that the mobility deterioration accompanying alloy diffusion (which occurs in a case of mixed crystal material) does not occur considerably due to a relatively small AlN molar fraction.

The mobility of two-dimensional electron gas starts decreasing in the range where y1>0.1, which changes more gradually compared with the specific resistance and the drain leakage current. On the other hand, the off-state breakdown voltage increases as the value of y1 becomes larger, and in the range where y1>0.1, the off-state breakdown voltage twice as large as the case where y1=0 or a larger off-state breakdown voltage is obtained. This is because the breakdown electric field increases along with an increase in bandgap of the channel layer 3.

From the above, when the channel layer 3 is formed so as to satisfy the composition range where x1=0 and $0.01 \leq y1 \leq 0.1$, the HEMT device 20 that has high mobility of two-dimensional electron gas and a small drain leakage current during OFF is achieved. On the other hand, when the channel layer 3 is formed so as to satisfy the composition range where x1=0 and $0.1 < y1 \leq 0.3$, the HEMT device 20 that has a small drain leakage current during OFF and has a high breakdown voltage is achieved. Note that the above similarly holds true for the HEMT device 10 that does not include the spacer layer 4 as described above. This is because the respective characteristics shown in FIG. 10 do not depend on the presence/absence of the spacer layer 4 except for the mobility.

(Manufacture of HEMT Device Including Spacer Layer)

The HEMT device 20 having the above-mentioned structure is manufactured by a similar method to that of the HEMT device 10 according to the first embodiment except for the process of forming the spacer layer 4.

Specifically, in manufacturing the epitaxial substrate 20A, the formation up to the channel layer 3 is performed, the susceptor temperature is set to a spacer layer forming temperature T3 (where T3 is approximately the same as T1), and the inside of the reactor is maintained at the nitrogen gas atmosphere. After that, the reactor pressure is set to 10 kPa, and then metal organic source gas and ammonia gas are introduced into the reactor, thereby forming the $In_{x3}Al_{y3}Ga_{z3}N$ layer serving as the spacer layer 4 to have a predetermined thickness.

The spacer layer 4 is formed in this manner, and then the barrier layer 5 is manufactured in a similar procedure to that in the case of manufacturing the above-mentioned epitaxial substrate 10A.

Note that the channel layer forming temperature T1 is set in the range where $950° C. \leq T1 \leq 1{,}250° C.$, whereas the barrier layer forming temperature T2 is set in accordance with the InN molar fraction of the barrier layer 5 in the range where $650° C. \leq T2 \leq 800° C.$, as described above. In addition, the spacer layer forming temperature T3(° C.) is set to be approximately the same as the channel layer forming temperature T1(° C.) as well. Therefore, in order to form the barrier layer 5, the susceptor temperature needs to be lowered after the formation of the channel layer 3 or the spacer layer 4. In the course of manufacturing the HEMT device 10 according to the first embodiment, in which the spacer layer 4 is not provided, the surface of the channel layer 3 remains exposed while the temperature drops, and thus this surface may be etched by atmosphere gas. To the contrary, in the case where the spacer layer 4 is provided at the spacer layer forming temperature T3 that is approximately the same as the channel layer forming temperature T1 as in this embodiment, the susceptor temperature is lowered after the formation of the spacer layer 4, whereby the spacer layer 4 acts as a protective layer of the surface of the channel layer 3. It is considered that the above also contributes to improvement in mobility of two-dimensional electron gas.

As described above, according to this embodiment, in a HEMT device in which the compositions of a channel layer and a barrier layer are determined as in the HEMT device according to the first embodiment, by providing a spacer layer between the channel layer and the barrier layer, it is possible to achieve a HEMT device capable of performing normally-off operation that has improved mobility of two-dimensional electron gas while having a high two-dimensional electron gas concentration similar to that of the HEMT device according to the first embodiment.

EXAMPLES

Example 1

In this example, the HEMT device 10 according to the first embodiment was manufactured. Specifically, a plurality of epitaxial substrates 10A having different combinations of the channel layer 3 and the barrier layer 5 were manufactured, to thereby manufacture the HEMT device 10 using each of them.

In manufacturing the epitaxial substrates 10A, first, a plurality of 6H—SiC substrates that have (0001) plane orientation and a diameter of two inches were prepared as the substrate 1. Each of the substrates 1 was placed in a reactor of an MOCVD apparatus, and an inside of the reactor was vacuumed. After that, a pressure inside the reactor was set to 30 kPa, thereby forming the atmosphere in hydrogen/nitrogen mixed flow state. Then, a temperature of the substrate was raised through susceptor heating.

When a susceptor temperature reached 1,050° C., Al source gas and ammonia gas were introduced into the reactor, to thereby form an AlN layer that serves as the buffer layer 2 and has a thickness of 200 nm.

Then, the susceptor temperature was maintained at a predetermined channel layer forming temperature T1(° C.) that is determined in a range where $950° C. \leq T1 \leq 1{,}250° C.$ in accordance with a target composition of the channel layer 3, and metal organic source gas and ammonia gas were introduced into the reactor at a flow rate corresponding to the target composition, to thereby form an $In_{x1}Al_{y1}Ga_{z1}N$ layer serving as the channel layer 3 to have a thickness of 2 μm. Note that the target composition of the channel layer 3 was set as four patterns in a manner that (x1, y1, z1)=(0, 0, 1), (0, 0.1, 0.9), (0, 0.2, 0.8) and (0, 0.3, 0.7). The channel layer forming temperature T1 thereof was set as 1,080° C., 1,100° C., 1,130° C. and 1,180° C.

After the channel layer 3 was obtained, the susceptor temperature was kept at the barrier layer forming temperature T2(° C.) determined by the equation T2=830−667·x2 in accordance with a target composition of the barrier layer 5, and the reactor pressure was set to 10 kPa after a nitrogen atmosphere was formed in the reactor. Then, metal organic source gas and ammonium gas were introduced into the reactor at the flow rate corresponding to the target composition, whereby an $In_{x2}Al_{y2}Ga_{z2}N$ layer serving as the barrier layer 5 was formed to have a thickness of 5 nm. Note that nitrogen gas was used for bubbling gas of metal organic source and carrier gas. The V/III ratio was set to 5,000.

After the formation of the barrier layer 5, the susceptor temperature was lowered to approximately room temperature. Then, the reactor was made open to the atmosphere after the inside of the reactor was returned to the atmospheric pressure, and then the manufactured epitaxial substrate 10A was taken out.

Next, the HEMT device 10 was manufactured using this epitaxial substrate 10A. Note that the HEMT device was designed such that a gate width was 1 mm, a source-gate distance was 0.5 μm, a gate-drain distance was 7.5 μm, and a gate length was 1.5 μm.

First, the portions that become boundaries between respective devices were removed by etching so as to have a depth of approximately 400 nm by the photolithography process and the RIE method.

Next, an $SiO_2$ film was formed on the epitaxial substrate 10A to have a thickness of 10 nm, and then by photolithography, the $SiO_2$ film in the positions where the source electrode 6 and the drain electrode 7 were to be formed was removed by etching, thereby obtaining an $SiO_2$ pattern layer.

Next, a metal pattern formed of Ti/Al/Ni/Au (film thickness thereof was 25/75/15/100 nm) was formed in the expected formation positions of the source electrode 6 and the drain electrode 7 by the vacuum deposition method and the photolithography process, to thereby form the source electrode 6 and the drain electrode 7. Then, in order to obtain excellent ohmic characteristics of the source electrode 6 and the drain electrode 7, heat treatment was performed for 30 seconds in the nitrogen gas atmosphere at 850° C.

Then, the $SiO_2$ film in the expected formation position of the gate electrode 8 was removed from the $SiO_2$ pattern layer using the photolithography process. Further, using the vacuum deposition method and photolithography, the gate electrode 8 was formed as the Schottky metal pattern formed of Pd/Au (film thickness thereof was 30/100 nm) in the expected formation position.

Through the process described above, the HEMT device 10 was obtained.

Note that for enabling measurement of the device characteristics, a passivation film of silicon nitride was formed in this HEMT device 10 using the CVD method and photolithography process, and then contact holes were made at positions corresponding to the source electrode 6, drain electrode 7 and gate electrode 8 of the passivation film, whereby wire bonding was performed.

The two-dimensional electron gas concentration and mobility of the plurality of HEMT devices 10 obtained in this manner were measured by the Hall effect method. In addition, the threshold voltage thereof was measured.

FIG. 2 to FIG. 5 show the results obtained by fixing the composition of the channel layer 3 and plotting the relationship between the composition of the barrier layer 5 and measurement results of the two-dimensional electron gas concentration and the threshold voltage on a ternary phase diagram with InN, AlN and GaN being vertices, based on values the two-dimensional electron gas concentration and threshold voltage obtained by measurement. Note that the mobility of two-dimensional electron gas took a value in the range of 300 to 400 $cm^2$/Vs.

The results above confirmed that a HEMT device that generates two-dimensional electron gas at high concentration of $1\times10^{13}/cm^2$ or more and that has a threshold voltage of 0 V or more thereby to be capable of performing normally-off operation was achieved by forming the channel layer 3 so as to satisfy the composition range of $In_{x1}Al_{y1}Ga_{z1}N$ (where x1+y1+z1=1, x1=0, 0≤y1≤0.3) and forming the barrier layer 5 so as to satisfy the composition range surrounded by the straight lines specified by Equation (1) to Equation (4) above in the ternary phase diagram as shown in FIG. 2 to FIG. 5.

Comparative Example 1

In this comparative example, the HEMT device was manufactured in a similar procedure to that of Example 1 except for that hydrogen was intentionally mixed into atmosphere gas in forming the barrier layer 5. FIG. 11 is a figure showing a list of two-dimensional electron gas concentrations of the HEMT device obtained in Example 1 and the HEMT device according to this comparative example that was obtained in the atmosphere into which hydrogen was mixed. Note that FIG. 11 shows, as a representative example, the results of two patterns of HEMT devices having different combinations of the composition of the channel layer 3 and the composition of the barrier layer 5. In addition, FIG. 11 shows the technique of mixing hydrogen in this comparative example as well.

As shown in FIG. 11, it was confirmed that the two-dimensional electron gas concentration decreased considerably in the HEMT device in which hydrogen was mixed into atmosphere gas in forming the barrier layer. That is, it was continued that the barrier layer was effectively formed in the atmosphere free from hydrogen, for example, in the nitrogen gas atmosphere as in Example 1.

Example 2

In this example, the HEMT device 20 according to the second embodiment was manufactured. Note that a procedure and manufacturing conditions similar to those of Example 1 were used except that the composition of the channel layer 3 was set as five patterns in which a pattern (x1, y1, z1)=(0, 0.01, 0.99) was added to the four patterns described in Example 1, and that the formation step for the spacer layer 4 was provided between the formation step for the channel layer 3 and the formation step for the barrier layer 5.

Specifically, after the formation of the channel layer 3, the susceptor temperature was kept at the predetermined spacer layer forming temperature T3 and the reactor pressure was set to 10 kPa. After that, metal organic source gas and ammonia gas were introduced into the reactor to form an $In_{x3}Al_{y3}Ga_{z3}N$ layer serving as the spacer layer 4, and then the channel layer 5 was formed. Note that the target composition of the spacer layer 4 was set as two patterns, (x3, y3, z3)=(0, 1, 0) and (0, 0.9, 0.1). The spacer layer forming temperature T3 thereof was made to be the same temperature as the channel layer forming temperature T1. In addition, the thickness of the spacer layer 4 was set as five levels of 0.3 nm, 0.5 nm, 1 nm, 1.5 nm and 2 nm such that a total thickness including the barrier layer 5 was 5 nm in each case.

As in Example 1, the concentration and mobility of two-dimensional electron gas of the obtained HEMT device 20 were measured and, at the same time, the X-ray diffraction, channel layer specific resistance, drain leakage current and off-state breakdown voltage thereof were measured. Measurement was performed during OFF in the state where −10V was applied as a gate bias voltage. In addition, as a drain leakage current, a current value when the source-drain voltage was 100 V was measured.

FIG. 8 shows the composition of the spacer layer 4 and the mobility of several HEMT devices 20 having different compositions of the channel layer 3 and the barrier layer 5. FIG. 8 shows the results in a case where the film thicknesses of the spacer layers 4 were each 1 nm. FIG. 9 shows the relationship between the film thickness of the spacer layer 4 and the mobility of two-dimensional electron gas. FIG. 9 shows the results in the case where the AlN layer was formed as the spacer layer 4. Those results reveal that by providing the spacer layer 4 having a thickness in a range of 0.5 nm to 1.5 nm, a HEMT device having a mobility three to four times higher compared with a HEMT device in which this was not provided was obtained. Note that a remarkable difference was not observed in two-dimensional electron gas concentration with the HEMT device according to Example 1 in which the spacer layer 4 was not provided.

Further, FIG. 10 shows mobilities, full widths at half maximum of peaks of a (0002) plane and a (10-12) plane in X-ray diffraction profile, channel layer specific resistances, drain leakage currents and off-state breakdown voltages of several HEMT devices 20 that have different compositions of the channel layer 3 and the barrier layer 5. The results of FIG. 10 confirmed that a HEMT device having high mobility of two-dimensional electron gas and small drain leakage current during OFF was achieved by forming the channel layer 3 so as to satisfy the composition range where x1=0 and 0.01≤y1≤0.1 and that a HEMT device having a small drain leakage current during OFF and a high breakdown voltage was achieved by forming the channel layer 3 so as to satisfy the composition range where x1=0 and 0.1≤y1≤0.3.

Example 3

In this example, a HEMT device was manufactured in a similar procedure to that of Example 2 except for that the pressure in a reactor when forming the barrier layer 5 was changed. The two-dimensional electron gas concentration and mobility of the obtained HEMT device were measured, and further, the measurement of the surface mean square roughness with an AFM, the measurement of contact resistance and the measurement of gate leakage current were performed. FIG. 12 is a figure showing a list of pressures in a reactor and the measurement results of the respective measurements above of the HEMT devices obtained in this example. Note that FIG. 12 shows, as a representative example, the results of two patterns of HEMT devices that have different combinations of the compositions of the channel layer 3 and the barrier layer 5.

It was confirmed from the results shown in FIG. 12 that two-dimensional electron gas having a high concentration and a high mobility is generated by setting the pressure in a reactor when forming the barrier layer 5 to 1 kPa or more and 30 kPa or less. Moreover, it was confirmed that HEMT device having a low ohmic contact resistance and a small gate leakage current (excellent Schottky contact characteristics) is obtained by setting the pressure in a reactor to 1 kPa or more and 20 kPa or less. This is considered to result from the fact that the surface flatness is improved (value of surface mean square roughness becomes smaller) by reducing the pressure in a reactor.

Example 4

In this example, a HEMT device was manufactured in a similar procedure to that of Example 2 except for that a V/III ratio in forming the barrier layer 5 was changed. The two-dimensional electron gas concentration and mobility of the obtained HEMT devices were measured, and further, the measurement of the surface mean square roughness with an AFM, the measurement of contact resistance and the measurement of gate leakage current were performed. FIG. 13 is a figure showing a list of pressures in a reactor and measurement results of the measurements above of the HEMT devices obtained in this example. Note that FIG. 13 shows the results of two patterns of HEMT devices that have different combinations of the composition of the channel layer 3 and the composition of the barrier layer 5.

It was confirmed from the results shown in FIG. 13 that by setting a V/III ratio in forming the barrier layer 5 to 3,000 or more and 20,000 or less, a HEMT device that generates two-dimensional electron gas having high concentration and mobility and has excellent device characteristics is obtained.

The invention claimed is:

1. A semiconductor device, comprising:
    an epitaxial substrate for a semiconductor device, comprising,
        a base substrate,
        a channel layer formed of a first group III nitride having a composition of $In_{x1}Al_{y1}Ga_{z1}N$ (x1+y1+z1=1), and
        a barrier layer formed of a second group III nitride containing at least In and Al and having a composition of $In_{x2}Al_{y2}Ga_{z2}N$ (x2+y2+z2=1); and
    a source electrode, a drain electrode and a gate electrode formed directly on said barrier layer of the epitaxial substrate for a semiconductor device, wherein:
    the barrier layer has a thickness of 5 nm or less;
    all of the source electrode, the drain electrode and the gate electrode consist of metal elements;
    the composition of said first group III nitride is in a range determined by x1=0 and 0≤y1≤0.3; and
    the composition of said second group III nitride is, in a ternary phase diagram with InN, AlN and GaN being vertices, in a range surrounded by straight lines respectively represented by the following expressions determined in accordance with the composition of said first group III nitride:

$$x2 = \frac{y2 - (0.27 + 0.5y1)}{1.78} = -\frac{z2 - (0.73 - 0.5y1)}{2.78};$$

$$x2 = \frac{y2 - (0.4 + 0.6y1)}{1.78} = -\frac{z2 - (0.6 - 0.6y1)}{2.78};$$

z2=0.4; and
z2=0.

2. The semiconductor device according to claim 1, wherein said epitaxial substrate for a semiconductor device further comprises
    a spacer layer formed of a third group III nitride having a composition of $In_{x3}Al_{y3}Ga_{z3}N$ (x3+y3+z3=1), said spacer layer being formed between said channel layer and said barrier layer, containing at least Al, and having larger bandgap energy compared with said barrier layer, and
    a total thickness of said spacer layer and said barrier layer is 5 nm or less.

3. The semiconductor device according to claim 2, wherein the composition of said third group III nitride is in a range determined by x3=0 and 0≤z3≤0.05.

4. The semiconductor device according to claim 3, wherein said third group III nitride is AlN.

5. The semiconductor device according to claim 1, wherein the composition of said first group III nitride is in a range determined by x1=0 and 0<y1≤0.1.

6. The semiconductor device according to claim 1, wherein the composition of said first group III nitride is in a range determined by x1=0 and 0.1<y1≤0.3.

7. A method of manufacturing an epitaxial substrate for a semiconductor device, comprising:
a channel layer forming step of epitaxially forming a channel layer formed of a first group III nitride on a base substrate, the first group III nitride having a composition of $In_{x1}Al_{y1}Ga_{z1}N$ (x1+y1+z1=1),
a barrier layer forming step of epitaxially forming a barrier layer formed of a second group III nitride on said channel layer, the second group III nitride containing at least In and Al and having a composition of $In_{x2}Al_{y2}Ga_{z2}N$ (x2+y2+z2=1); and
an electrode forming step of forming a source electrode, a drain electrode and a gate electrode directly on said barrier layer, wherein:
the barrier layer has a thickness of 5 nm or less;
all of the source electrode, the drain electrode and the gate electrode consist of metal elements;
the composition of said first group III nitride is selected in a range determined by x1=0 and 0≤y1≤0.3; and
the composition of said second group III nitride is selected, in a ternary phase diagram with InN, AlN and GaN being vertices, in a range surrounded by straight lines respectively represented by the following expressions determined in accordance with the composition of said first group III nitride:

$$x2 = \frac{y2 - (0.27 + 0.5y1)}{1.78} = -\frac{z2 - (0.73 - 0.5y1)}{2.78};$$

$$x2 = \frac{y2 - (0.4 + 0.6y1)}{1.78} = -\frac{z2 - (0.6 - 0.6y1)}{2.78};$$

z2=0.4; and
z2=0.

8. The method of manufacturing an epitaxial substrate for a semiconductor device according to claim 7, wherein:

a temperature T1(° C.) for forming said channel layer is determined in a range where 950° C.≤T1≤1,250° C.; and
a temperature T2(° C.) for forming said barrier layer is determined in a range determined in accordance with a molar fraction x2 of InN of said second group III nitride, the range satisfying:

$$800-667 \cdot x2(° C.) \leq T2 \leq 860-667 \cdot x2(° C.); \text{ and}$$

$$600° C. \leq T2 \leq 850° C.$$

9. The method of manufacturing an epitaxial substrate for a semiconductor device according to claim 7, wherein nitrogen gas is used in said barrier layer forming step.

10. The method of manufacturing an epitaxial substrate for a semiconductor device according to claim 7, further comprising:
a spacer layer forming step of forming, after the formation of said channel layer, a spacer layer formed of a third group III nitride having a composition of $In_3Al_{y3}Ga_{z3}N$ (x3+y3+z3=1) on said channel layer, said third group III nitride containing at least Al and having larger bandgap energy compared with said barrier layer,
wherein said barrier layer is formed on said spacer layer.

11. The method of manufacturing an epitaxial substrate for a semiconductor device according to claim 10, wherein a temperature T3(° C.) for forming said spacer layer in said spacer layer forming step is substantially equal to said temperature T1(° C.) for forming said channel layer.

12. The method of manufacturing an epitaxial substrate for a semiconductor device according to claim 7, wherein a pressure in a reactor is set to 1 kPa or more and 30 kPa or less in said barrier layer forming step.

13. The method of manufacturing an epitaxial substrate for a semiconductor device according to claim 12, wherein the pressure in the reactor is set to 1 kPa or more and 20 kPa or less in said barrier layer forming step.

14. The method of manufacturing an epitaxial substrate for a semiconductor device according to claim 7, wherein a V/III ratio is set to 5,000 or more and 20,000 or less in said barrier layer forming step.

* * * * *